United States Patent

Kannler

[11] Patent Number: 5,852,543
[45] Date of Patent: Dec. 22, 1998

[54] GUIDE RAIL SET FOR ELECTRICAL COMPONENTS OF ELECTRICAL DEVICES GUIDED IN GUIDE RAILS

[75] Inventor: Bernhard Kannler, Augsburg, Germany

[73] Assignee: Siemens Nixdorf Informationssysteme AG, Paderborn, Germany

[21] Appl. No.: 806,443

[22] Filed: Feb. 26, 1997

[30] Foreign Application Priority Data

Feb. 26, 1996 [DE] Germany .................. 196 07 142.9

[51] Int. Cl.$^6$ ................................................. H02B 11/12
[52] U.S. Cl. ...................... 361/608; 361/801; 361/802; 211/41.17; 403/397
[58] Field of Search ........................ 361/608, 801, 361/802; 211/41.17; 403/397

[56] References Cited

U.S. PATENT DOCUMENTS

| | | |
|---|---|---|
| 3,899,721 | 8/1975 | Borchard et al. . |
| 4,327,835 | 5/1982 | Leger ........................ 361/802 |
| 4,534,472 | 8/1985 | Hanseler et al. ............. 361/802 |
| 4,688,148 | 8/1987 | Mallory et al. .............. 361/740 |
| 5,156,280 | 10/1992 | Joist .......................... 361/801 |
| 5,191,514 | 3/1993 | Kabat et al. ................. 361/802 |

FOREIGN PATENT DOCUMENTS

| | | |
|---|---|---|
| 0 688 156 | 12/1995 | European Pat. Off. . |
| 155 847 | 7/1982 | Germany . |

*Primary Examiner*—Lynn D. Feild
*Assistant Examiner*—Boris L. Chervinsky
*Attorney, Agent, or Firm*—Hill & Simpson

[57] ABSTRACT

For a fast and simple mounting and unmounting of guide rails for electrical components of electrical devices in guide rails, the guide rail set is provided, which is engaged in the frame parts by being placed against and axially displaced in the frame parts of the electrical device. An unmounting occurs, among other things, by pressing a spring tongue responsible for the engagement back to release the rail for movement for unmounting.

5 Claims, 1 Drawing Sheet

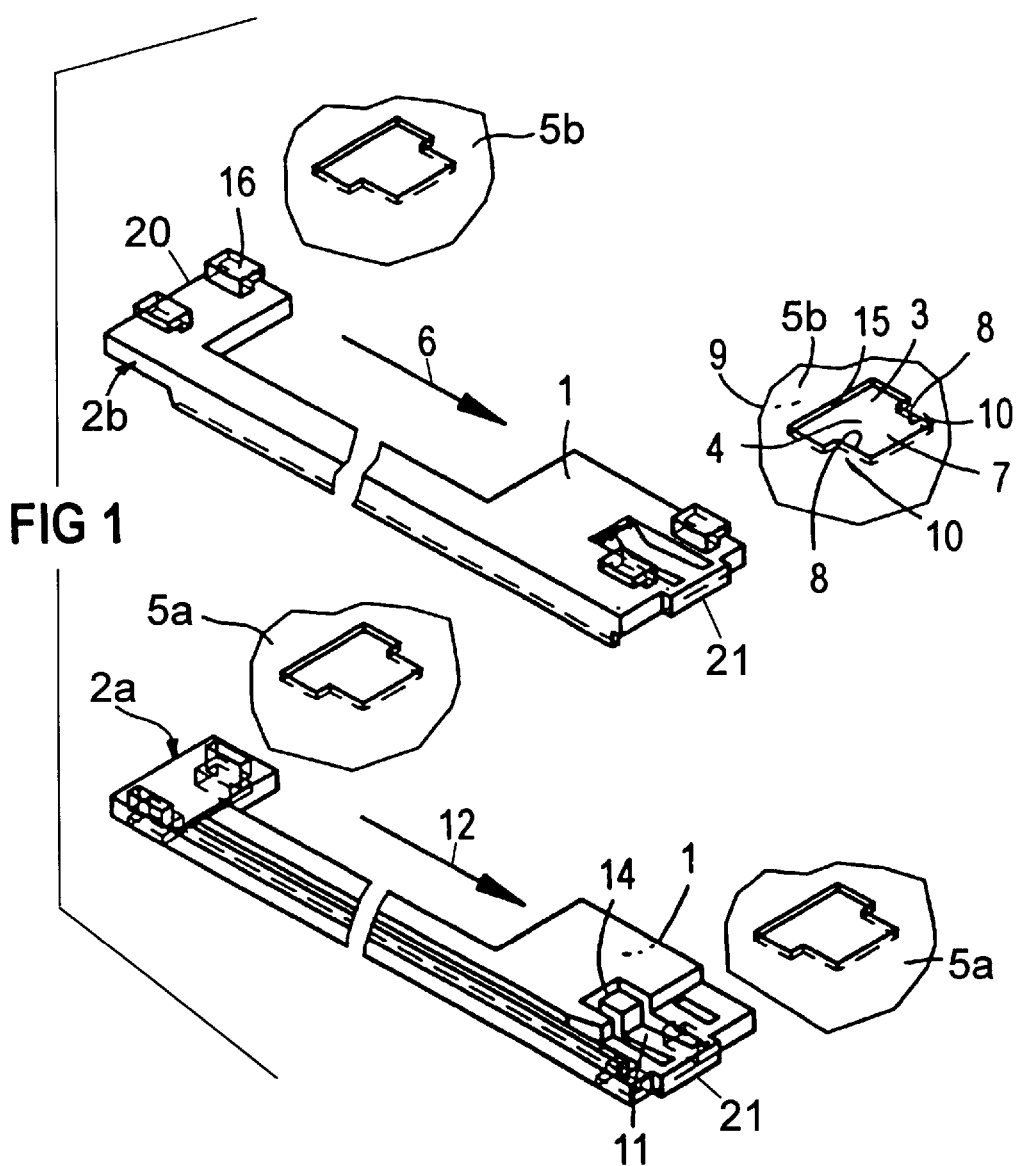

GUIDE RAIL SET FOR ELECTRICAL COMPONENTS OF ELECTRICAL DEVICES GUIDED IN GUIDE RAILS

BACKGROUND OF THE INVENTION

The present invention is directed to a guide rail set for an electrical component of an electrical device. The guide rails of the set are two identical rails that are fashioned mirror-symmetrically relative to one another, except for the fastening means, which are disposed at the respective ends of the rails for fastening the rails to two frame parts of the electrical device and which guide rails, when in a mounted condition, have a back surface lying against a seating surface of the frame part of the electrical device and are provided with facing surfaces having guide channels lying opposite one another for receiving an electrical component.

Given electrical devices whose electrical components are held in guide rails, there is a problem with regard to the time-consuming attachment of the guide rails to the frame of the electrical device during the assembly of the electrical device. Two guide rails that together form a guide rail set for a particular electrical component are thereby required for each individual electrical component. There is also the problem of simple and fast release of the guide rails from the frame of the electrical device or apparatus. Another problem is that, in order to keep the volume expanse of the electrical device as small as possible, an optimally slight distance should be provided between a lower guide rail of an electrical component of the electrical device in a higher story or level position of the electrical device and an upper guide rail arranged directly therebelow for an electrical component of the electrical device, which is arranged in a lower story or level position. However, a lower guide rail of the higher level and an upper guide rail arranged directly therebelow in a lower level that lie as close as possible to one another contributes to the problem of not being able to mount and unmount the guide rails in a simple way, since the rails will impede one another in terms of access to fastening screws from the respective back sides of the guide rails.

An example of a guide rail with this type of problem is disclosed in European Published Application 0 688 156.

Other examples of guide rails are disclosed in U.S. Pat. No. 3,899,721, which is incorporated herein by reference thereto, and in East German Patent 155 847. The guide rails of these two devices have the problem that they respectively comprise hook noses respectively arranged on a longitudinal axis on the back surface of each rail for engaging behind the surface of corresponding apertures in the frame parts given longitudinal displacement of the rail. These given pairs of guide rails placed back-to-back against one another will impede the guide rails that are placed against one another from proceeding maximally close to one another. In other words, a guide rail disposed on one surface of a rack frame will impede the insertion of a guide rail on the opposite surface, unless the two surfaces are sufficiently far apart to enable the insertion of the two rails.

SUMMARY OF THE INVENTION

An object of the present invention is an improved guide rail set for electrical components of an electrical device, so that they do not exhibit the problem mentioned above and that they can be mounted and unmounted in a simple way and can also be mounted with an optimally slight spacing between a lower guide rail in an upper level or story position and an upper guide rail arranged directly therebelow in a lower level or story position.

To accomplish these goals, the present invention is directed to an improvement in a guide rail set for electrical components of electrical devices guided in guide rails, which set is composed of two individual guide rails that are fashioned mirror-symmetrically relative to one another, except for fastening means, which are disposed on respective ends for fastening each rail to frame parts of an electrical device and which rails, in the mounted condition, have a back surface of the rail lying against a seating surface of the frame parts and are allocated to one another with the surfaces facing the opposite rail providing guide channels lying opposite one another for receiving the component. The improvements include the fastening means of each guide rail having a first sub-group on a back surface of the guide rail which are introduced during mounting of the guide rail into a T-shaped slot having a transverse sub-opening and a longitudinal sub-opening in the direction of movement of the rail during mounting, said fastening means embracing lateral longitudinal edges of the longitudinal sub-opening and being engaged onto a cooperating surface of the frame part lying opposite to the seating surface, which receives the back surface of the rail, and that the fastening means of each guide rail belonging to the guide rail set are arranged offset relative to one another on the back surface of the individual guide rail so that when the guide rails are placed against one another back surface-to-back surface, the fastening means are positioned offset next to one another and the fastening means includes a second sub-group as a spring tongue that will project toward the back relative to the axial displacement of the guide rail during mounting and has a free end that projects beyond a back surface of the respective guide rail.

The set of guide rails is composed of two individual guide rails that supplement one another, not only in terms of the guide function for an electrical component, but also in terms of the fastening function. The means for fastening the guide rails are fashioned on a back surface of the guide rails lying opposite the guide channel for the insertion of the electrical component so that, when the guide rail is mounted, these fastening means can be introduced into a transverse sub-opening of T-shaped slots or apertures in a frame part of the electrical device and can be moved into the longitudinally residing sub-opening of the T-shaped apertures with an axial longitudinal displacement of the guide rail. Within the longitudinally arranged sub-opening of the T-shaped slot or aperture of the frame part of the electrical device, the fastening means embraces the lateral longitudinal edges of the longitudinally arranged sub-opening and are engaged onto a cooperating surface of the frame part, which cooperating surface is opposite the seating surface and proceeds parallel to the seating surface. The guide rail is, thus, prevented from falling out perpendicular to the seating surface of the frame part. For mounting the guide rail, the guide rail is simply applied and displaced in an axial direction. A simple mounting is thus obtained. For unmounting, the guide rail is simply pushed back and removed. Simple unmounting is, thus, also possible.

The fastening means of each of the guide rails belonging to the guide rail set also are arranged offset relative to one another on the back surface of the individual guide rails so that when the guide rails of the set are placed against one another, the fastening means are positioned offset next to one another. As a result thereof, a lower guide rail in an upper or higher story or level position of an electrical device and an upper guide rail that is arranged directly therebelow in the lower story position or level can be positioned maximally close to one another. An optimally slight volume expanse of the electrical device can thereby be obtained, since the support surfaces for the two levels can be closer together.

The guide rails comprise spring tongues that will project toward the back relative to the axial displacement direction of the guide rails when they are mounted and whose free ends project beyond the back surface of the guide rails. When the guide rails are mounted, which occurs by placing the guide rails on the frame part and axial displacement of the guide rails, the spring tongues are pressed back by the seating surface at the frame part of the electrical device and, in the mounted position of the guide rail within the aperture of the frame part, spring back and engage a cooperating shoulder on the frame part. The guide rail is thereby prevented from being inadvertently pushed back. For unmounting, the spring tongue is pressed back and the guide rail can then be pushed in the reverse direction.

Preferably, the mounting devices include L-shaped hook noses for a first set of the fastening means.

Accordingly, spring tongues are arranged at such a location between the L-shaped hook noses that, in the mounted position of the guide rail, the spring tongues will engage the T-shaped aperture of the frame part and, thus, an additional aperture for the spring tongue is not required.

In another advantageous development of the invention, the end face of the free end of the spring tongues comprises a step-shaped edge course of which, in the mounted position of the guide rails, a first step is arranged above the seating surface of the frame part and a second step is allocated to a cooperating shoulder formed by an edge of the aperture in the frame part. The spring tongue can then be pulled back from the guide channel side with a suitable tool. Access to a back surface of the guide rail is no longer required to accomplish removal of the rail.

Other advantages and features of the invention will be readily apparent from the following description of the preferred embodiments, the drawings and claims.

BRIEF DESCRIPTION OF THE DRAWINGS

FIG. 1 is a schematic perspective view of an arrangement of a guide rail set of the present invention being disposed within a partially shown frame parts of an electrical device;

FIG. 2 is a partial cross sectional view of a front end of a guide rail of FIG. 1 installed in a frame part of an electrical device; and FIG. 3 is a cross sectional view illustrating the installation of two guide rails aligned one above the other at two levels in a device.

DESCRIPTION OF THE PREFERRED EMBODIMENTS

The principles of the present invention are particularly useful when incorporated in two mirror-symmetrically fashioned guide rails 2a and 2b of FIG. 1. The back surface 1 of an upper guide rail 2b is visible. The L-shaped hook noses 16 are arranged in pairs, with the bent L-shape pointing away from one another, with one pair being disposed adjacent a rear end 20 and a second pair being adjacent the front end 21 of the rail 2b.

The electrical device has frame parts 5b for the upper portion of the compartment or shelf and frame parts 5a for the lower portion. Each of these frame parts 5a and 5b is provided with T-shaped openings or apertures, which have a transversely-residing sub-opening or portion 3 and a longitudinally-residing sub-opening 7, which are designed to receive the hook noses 16 of each of the rails. The mounting of the guide rails, such as the upper rail 2b, occurs by placing the guide rail against the frame part 5b of the electrical device in such a way that the L-shaped hook noses 16 extend into the transversely-residing sub-opening 3 and by subsequent longitudinal displacement in the direction of arrow 6. The L-shaped hook noses thereby will embrace lateral spaced longitudinal edges 8 of the longitudinal sub-opening 7 of the T-shaped aperture 4. This occurs with the L-shaped hook noses 16 adjacent the rear end 20 and the front end 21. By embracing the lateral longitudinal edges 8, the L-shaped hook noses 16 come to lie against cooperating surfaces 10 of the frame part, which are opposite a surface 9 which engages the surface 1. Thus, the guide rail, such as 2b, is placed against the frame part 5b of the electrical device, with the back surface 1 of the guide rail 2b engaging a seating surface 9 of the frame part 5b.

Each of the guide rails 2a and 2b includes a spring tongue 11 adjacent a front end 21. As illustrated in FIG. 2, the guide rail 2a has a spring tongue 11 which is arranged projecting from a front end 21 rearward toward the back relative to the axial displacement direction, such as indicated by the arrow 12 of FIG. 1. In the mounted condition of the guide rail 2a, the free end of the spring tongue 11 projects into the T-shaped aperture 4 of the frame part 5a. This is achieved in that the spring tongue 11 is arranged between the two L-shaped hook noses 16. The end face 14 of the spring tongue 11 is thereby supported against a cooperating shoulder 15 formed by a rear edge of the T-shaped opening 4.

The end face 14 of the spring tongue 11, as best shown in FIG. 2, can be fashioned step-shaped. A first step 17 is thereby arranged above the seating surface 9 of the frame part 5a when in the mounted position of the guide rail 2a. This step 17 provides an abutting surface for applying a tool when the spring tongue 11 is to be lifted to such an extent for releasing the spring tongue so that the tongue can be pushed over the T-shaped aperture of the frame part. The guide rail 2a can then be removed from the T-shaped aperture 4 by being pushed axially in a direction opposite to the arrow 12.

As best illustrated in FIG. 3, the L-shaped hook noses 16 are arranged offset next to one another given a close allocation of two guide rails 2a and 2b, being positioned on each side of a shelf of the electrical device. The guide rail 2a is allocated to the upper level of the device, while the guide rail 2b is allocated to the lower level or shelf position of the electrical device. Corresponding to the distinction between the guide rails 2a and 2b, a distinction is made between the L-shaped hook noses 16a and 16b, which are offset relative to one another, with the L-shaped hook nose 16a being part of the guide rail 2a and the L-shaped hook nose 16b being part of the guide rail 2b. Thus, the fame part's 5a aperture 4a is offset relative to the frame part's 5b aperture 4b, as shown in FIG. 3. The hook noses, as illustrated, are offset so that the hook noses 16a are closer to a side 30 of the rail 2a and the hook noses 16b are offset toward the opposite side 31 of the rail 2b.

As also illustrated in FIG. 3, when inserted in the respective mounting supports 5a and 5b, each of the rails 2a and 2b has channels 35, which are aligned one above the other so that the components in the upper and lower levels are aligned one above the other.

Although various minor modifications may be suggested by those versed in the art, it should be understood that I wish to embody within the scope of the patent granted hereon all such modifications as reasonably and properly come within the scope of my contribution to the art.

I claim:

1. In a guide rail set for receiving an electrical component of an electrical device, each set being composed of two individual guide rails, each guide rail, at the respective ends of the rails, having means for fastening the rail to a frame part of an electrical device so that when the rails are mounted in the device, a back surface of each of the rails is against a seating surface of the frame part and a front surface of each rail has allocated guide channels which lie opposite one another for receiving the component part, the improvements comprising the seating surface of the frame part having a T-shaped aperture for each fastening means, each T-shaped aperture having a transverse portion and a longitudinal portion, each fastening means including a sub-group being provided on a back surface of each of the guide rails for introduction into the transverse portion of the T-shaped aperture in the frame part of the electrical device and with axial longitudinal displacement of the guide rail, the sub-group is shifted into the longitudinal portion of the aperture for embracing longitudinal edges of the longitudinal portion of the T-shaped aperture of the frame part, said sub-group of each of the fastening means of one guide rail of the set being arranged offset to the sub-group of the fastening means of the other guide rail of said set so that when the guide rails of the set are placed with the back surfaces against one another, the fastening means are positioned offset next to one another, and at least one sub-group of each guide rail including a spring tongue that projects from a position adjacent a front edge of each rail toward a back end of the rail in a direction opposite to the axial displacement of the guide rail during mounting and having a free end that projects beyond a back surface of the respective guide rail for engaging an edge of one of the T-shaped apertures.

2. In a guide rail set according to claim 1, wherein the end face of the free end of the spring tongue comprises a step-shaped edge with a first step and a second step arranged so that during the mounted condition of the guide rial, the first step is arranged above the seating surface of the frame part and an end face of the second step is allocated to a cooperating shoulder formed by an edge of the T-shaped aperture of the frame part.

3. In a guide rail set according to claim 2, wherein each of the sub-groups of fastening means comprises L-shaped hook noses.

4. In a guide rail set according to claim 1, wherein the sub-group of fastening means comprises L-shaped hook noses.

5. In a guide rail set according to claim 1, wherein the sub-group of fastening means comprises L-shaped hook noses with the hooks facing outward, and said spring tongue extends between said pair.

\* \* \* \* \*